United States Patent
Dokan

(10) Patent No.: US 12,198,962 B2
(45) Date of Patent: Jan. 14, 2025

(54) MAINTENANCE DEVICE, VACUUM PROCESSING SYSTEM, AND MAINTENANCE METHOD

(71) Applicant: Tokyo Electron Limited, Tokyo (JP)

(72) Inventor: Takashi Dokan, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/213,266

(22) Filed: Jun. 23, 2023

(65) Prior Publication Data

US 2023/0330715 A1 Oct. 19, 2023

Related U.S. Application Data

(63) Continuation of application No. PCT/JP2021/047965, filed on Dec. 23, 2021.

(30) Foreign Application Priority Data

Dec. 25, 2020 (JP) ................. 2020-217058

(51) Int. Cl.
*B08B 5/04* (2006.01)
*B08B 7/00* (2006.01)
*H01L 21/677* (2006.01)

(52) U.S. Cl.
CPC .......... *H01L 21/67724* (2013.01); *B08B 5/04* (2013.01); *B08B 7/0042* (2013.01); *B08B 2205/00* (2013.01)

(58) Field of Classification Search
None
See application file for complete search history.

(56) References Cited

U.S. PATENT DOCUMENTS

| | | | |
|---|---|---|---|
| 2003/0147075 A1* | 8/2003 | Otsuki | C23C 16/4405 356/338 |
| 2020/0013657 A1 | 1/2020 | Lee et al. | |

FOREIGN PATENT DOCUMENTS

| | | |
|---|---|---|
| JP | 2001-044177 A | 2/2001 |
| JP | 2008-053661 A | 3/2008 |
| JP | 2010-165726 A | 7/2010 |
| JP | 2017-163088 A | 9/2017 |
| JP | 2018-133464 A | 8/2018 |

OTHER PUBLICATIONS

Google Patents translation of JP 2017163088 (Year: 2023).*

(Continued)

*Primary Examiner* — Eric W Golightly
(74) *Attorney, Agent, or Firm* — XSENSUS LLP

(57) ABSTRACT

There is provided a maintenance device comprising: a case having an opening whose size corresponds to a second gate of a vacuum processing device disposed in a processing chamber having a first gate and the second gate different from the first gate, the first gate and the second gate being used for loading and unloading substrates, the opening being capable of being attached to the second gate in a detachable manner and an airtight manner; a depressurization mechanism configured to reduce a pressure in the case; and a suction mechanism disposed in the case and configured to enter the processing chamber through the opening and conduct suction of deposits on an object in the processing chamber.

17 Claims, 11 Drawing Sheets

(56) References Cited

OTHER PUBLICATIONS

International Search Report and Written Opinion mailed on Mar. 29, 2022, received for PCT Application PCT/JP2021/047965, filed on Dec. 23, 2021, 13 pages including English Translation.
English translation of International Preliminary Report On Patentability (Chapter II) dated on Sep. 6, 2022, in corresponding PCT/JP2021/047965, 3 pages.

* cited by examiner

MAINTENANCE DEVICE, VACUUM PROCESSING SYSTEM, AND MAINTENANCE METHOD

CROSS-REFERENCE TO RELATED APPLICATIONS

This application is a Bypass Continuation application of PCT International Application No. PCT/JP2021/047965, filed on Dec. 23, 2021, which designated the United States. This application claims priority to Japanese Patent Application No. 2020-217058, filed on Dec. 25, 2020, the entire contents of which are incorporated herein by reference.

TECHNICAL FIELD

The present disclosure relates to a maintenance device, a vacuum processing system, and a maintenance method.

BACKGROUND

There is known a vacuum processing apparatus for performing various substrate treatments on a substrate such as a semiconductor wafer (hereinafter, referred to as "wafer") disposed in a processing chamber maintained in a vacuum state. In this vacuum processing apparatus, it is required to clean the inside of the processing chamber without opening it to the atmosphere in order to reduce downtime.

In this regard, Patent Document 1 discloses a technique for cleaning the inside of a processing chamber by allowing an adsorption unit to adsorb unnecessary substances in the processing chamber. The processing chamber includes a first gate used for loading and unloading a substrate, and a second gate to which a maintenance device having the adsorption unit can be attached.

PRIOR ART DOCUMENTS

Patent Documents

Patent Document 1: Japanese Patent Application Publication No. 2018-133464

SUMMARY

The present disclosure provides a technique capable of efficiently cleaning the inside of a processing chamber without opening it to the atmosphere.

A maintenance device according to an aspect of the present disclosure comprises: a case having an opening whose size corresponds to a second gate of a vacuum processing device disposed in a processing chamber having a first gate and the second gate different from the first gate, the first gate and the second gate being used for loading and unloading substrates, the opening being attached to the second gate in a detachable manner and an airtight manner; a depressurization mechanism configured to reduce a pressure in the case; and a suction mechanism that is disposed in the case, enters the processing chamber through the opening, and conducts suction of deposits on an object in the processing chamber.

In accordance with the present disclosure, it is possible to efficiently clean the inside of the processing chamber without opening it to the atmosphere.

DETAILED DESCRIPTION

Figure 1:
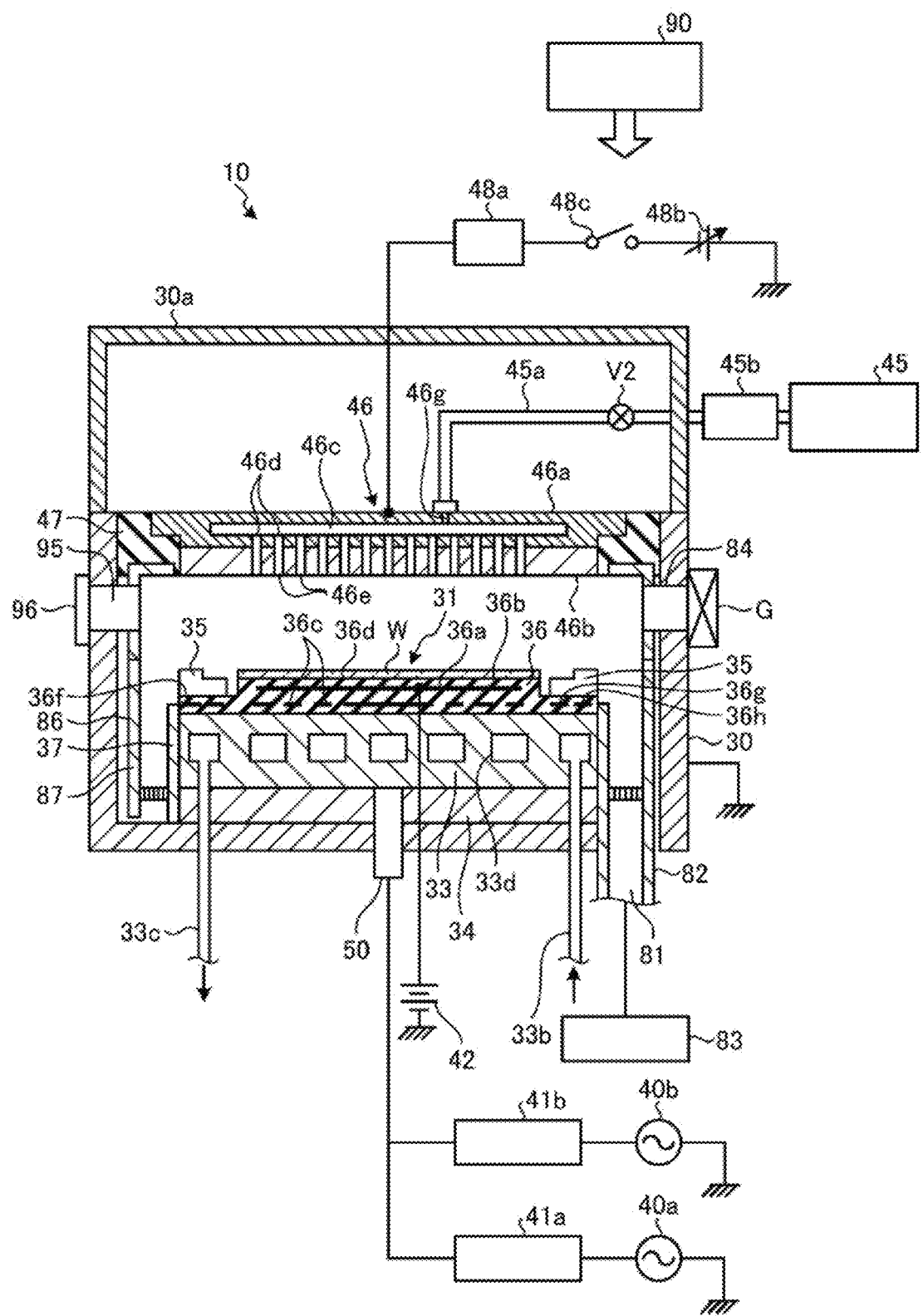
FIG. 1 schematically shows a plasma etching apparatus according to an embodiment.

Hereinafter, embodiments of a maintenance device, a vacuum processing system, and a maintenance method of the present disclosure will be described in detail with reference to the accompanying drawings. Like reference numerals will be given to like or corresponding parts throughout the drawings. The following embodiments are not intended to limit a processing apparatus of the present disclosure.

[Configuration of Maintenance Target Device]

A maintenance target device whose maintenance is performed by a maintenance device will be described. The maintenance target device is a vacuum processing device for performing predetermined substrate processing on a substrate such as a wafer or the like in a processing chamber maintained in a vacuum state. In the present embodiment, an example in which the maintenance target device is a plasma etching apparatus for performing plasma etching on a substrate will be described. The maintenance target device is not limited to the plasma etching apparatus.

FIG. 1 schematically shows a plasma etching apparatus according to an embodiment. A plasma etching apparatus 10 includes a processing chamber 30 that is maintained in an airtight state and is electrically grounded. The processing chamber 30 has a cylindrical shape, and is made of aluminum having an anodically oxidized surface, for example. The processing chamber 30 defines a processing space in which plasma is generated. A placing table 31 for horizontally supporting the wafer W is accommodated in the processing chamber 30.

The placing table 31 has a substantially cylindrical shape with a bottom surface facing in the vertical direction, and an upper surface of the placing table 31 is a placing surface 36d. A placing surface 36d of the placing table 31 is slightly smaller than the wafer W. The placing table 31 includes a base 33 and an electrostatic chuck 36.

The base 33 is made of a conductive metal such as aluminum or the like. The base 33 functions as a lower electrode. The base 33 is supported by a support 34 made of an insulating material. The support 34 is disposed at the bottom portion of the processing chamber 30.

The electrostatic chuck 36 has a convex substrate placing portion at an upper central portion thereof. The upper surface of the substrate placing portion serves as the placing surface 36d on which the wafer W is placed. The electrostatic chuck 36 is disposed at the center of the placing table 31 in plan view. The electrostatic chuck 36 is an example of a placing part on which a substrate can be placed. The electrostatic chuck 36 has an electrode 36a and an insulator 36b. The electrode 36a is disposed in the insulator 36b, and a DC power supply 42 is connected to the electrode 36a. The electrostatic chuck 36 is configured to attract the wafer W by a Coulomb force generated by applying a DC voltage from the DC power supply 42 to the electrode 36a. In addition, a heater 36c is disposed in the insulator 36b of the electrostatic chuck 36. The heater 36c receives a power through a power supply mechanism to be described later, and controls the temperature of the wafer W.

An outer peripheral portion formed of the insulator 36b and lower than the placing surface 36d is disposed around the placing surface 36d of the placing table 31. The upper surface of the outer peripheral portion serves as an ER placing surface 36f for placing an edge ring 35. The edge ring 35 made of, for example, single crystalline silicon is disposed on the ER placing surface 36f of the placing table 31. The electrostatic chuck 36 has a pair of electrodes 36g and 36h at positions overlapping the edge ring 35 in plan view. The pair of electrodes 36g and 36h are disposed in the insulator 36b. The electrostatic chuck 36 is configured to attract the edge ring 35 by a Coulomb force generated by applying a DC voltage from a DC power supply (not shown) to the pair of electrodes 36g and 36h. Although the example of FIG. 1 shows the case where the pair of electrodes 36g and 36h are disposed in the electrostatic chuck 36, the pair of electrodes 36g and 36h may be disposed in a ring-shaped dielectric separate from the electrostatic chuck 36. In the example of FIG. 1, the pair of electrodes 36g and 36h constitute a bipolar electrodes. However, a unipolar electrode may be used instead of the pair of electrodes 36g and 36h. In addition, a cylindrical inner wall member 37 made of quartz or the like is disposed to surround the placing table 31 and the support 34.

A power supply rod 50 is connected to the base 33. The power supply rod 50 is connected to a first RF power supply 40a through a first matching device 41a, and is connected to a second RF power supply 40b through a second matching device 41b. The first RF power supply 40a is used for plasma generation, and is configured to supply an RF power of a predetermined frequency from the first RF power supply 40a to the base 33 of the placing table 31. The second RF power supply 40b is used for ion attraction (bias), and is configured to supply an RF power of a predetermined frequency lower than that of the first RF power supply 40a from the second RF power supply 40b to the base 33 of the placing table 31.

A channel 33d is formed in the base 33. The channel 33d has one end connected to a heat transfer fluid inlet line 33b and the other end connected to a heat transfer fluid outlet line 33c. In the plasma etching apparatus 10, the temperature of the placing table 31 can be controlled by circulating a heat transfer fluid, such as fluorine-based inert liquid having a high insulation property and low viscosity, pure water, or the like, in the channel 33d. In the plasma etching apparatus 10, the temperature of the wafer W and the temperature of the edge ring 35 may be individually controlled by providing separate channels in the base 33 to correspond to the region where the wafer W is disposed and the region where the edge ring 35 is disposed. In the plasma etching apparatus 10, a heat transfer gas may be supplied to the backside of the wafer W and the back surface of the edge ring to individually control the temperature of the wafer W and the temperature of the edge ring 35. For example, a gas supply line for supplying a heat transfer gas (backside gas) such as helium gas or the like to the backside of the wafer W may be provided to penetrate through the placing table 31 and the like. The gas supply line is connected to a gas supply source. With this configuration, the wafer W attracted and held by the electrostatic chuck 36 on the upper surface of the placing table 31 is controlled to a predetermined temperature.

On the other hand, a shower head 46 that functions as an upper electrode is disposed above the placing table 31 to face the placing table 31 in parallel. The shower head 46 and the placing table 31 function as a pair of electrodes (upper electrode and lower electrode).

The shower head 46 is disposed at a ceiling wall of the processing chamber 30. The shower head 46 includes a main body 46a and an upper ceiling plate 46b forming an electrode plate. The shower head 46 is supported at the upper portion of the processing chamber 30 via an insulating member 47. The main body 46a is made of a conductive material, such as aluminum having an anodically oxidized surface. The upper ceiling plate 46b is detachably supported below the main body 46a.

The main body 46a has a gas diffusion space 46c therein. A large number of gas flowing holes 46d are formed in the bottom portion of the main portion 46a to be located lower than the gas diffusion space 46c. Gas injection holes 46e penetrate through the upper ceiling plate 46b in a thickness direction to overlap the gas flowing holes 46d. With this configuration, a processing gas supplied to the gas diffusion space 46c is diffused and supplied in a shower-like manner into the processing chamber 30 through the gas flowing holes 46d and the gas injection holes 46e.

A gas inlet port 46g for introducing a processing gas into the gas diffusion space 46c is formed at the main body 46a. A gas supply line 45a has one end connected to the gas inlet port 46g and the other end connected to a processing gas supply source 45 for supplying a processing gas. A mass flow controller (MFC) 45b and an on-off valve V2 are disposed in the gas supply line 45a in that order from an upstream side. The processing gas for plasma etching is supplied from the processing gas supply source 45 to the gas diffusion space 46c through the gas supply line 45a. The processing gas is diffused and supplied in a shower-like manner into the processing chamber 30 through the gas flowing holes 46d and the gas injection holes 46e.

A variable DC power supply 48b is electrically connected to the shower head 46 serving as the upper electrode through a low pass filter (LPF) 48a. On/off of power supply from the variable DC power supply 48b can be controlled by an on/off switch 48c. A current and a voltage of the variable DC power supply 48b and an on/off operation of the on/off switch 48c are controlled by a controller 90 to be described later. As will be described later, when the RF power is applied to the placing table 31 from the first RF power supply 40a and the second RF power supply 40b to generate plasma in the processing space, on the on/off 48c is turned on by the controller 90 and a predetermined DC voltage is applied to the shower head 46 as the upper electrode, if necessary.

Further, a cylindrical ground conductor 30a extends upward from the sidewall of the processing chamber 30 to be located higher than the shower head 46. The cylindrical ground conductor 30a has a ceiling wall at the top thereof.

An exhaust port 81 is formed at the bottom portion of the processing chamber 30. An exhaust device 83 is connected to the exhaust port 81 through an exhaust line 82. The exhaust device 83 has a vacuum pump, and is configured to reduce the pressure in the processing chamber 30 to a predetermined vacuum level by operating the vacuum pump.

On the other hand, a first gate 84 used for loading/unloading the wafer W is disposed on the inner sidewall of the processing chamber 30. The first gate 84 is provided with a gate valve G for opening/closing the first gate 84. The first gate 84 is airtightly connected to the vacuum transfer chamber through the gate valve G, so that the wafer W can be loaded to and unloaded from the vacuum transfer chamber while maintaining the vacuum atmosphere.

A deposition shield 86 is disposed along the inner wall surface of the processing chamber 30. The deposition shield 86 prevents reaction by-products (deposits) generated by the etching process using plasma from being attached to the processing chamber 30. The deposition shield 86 is detachably provided.

The controller 90 controls an overall operation of the plasma etching apparatus 10 configured as described. The controller 90 is, for example, a computer, and controls individual components of the plasma etching apparatus 10. The overall operation of the plasma etching apparatus 10 is controlled by the controller 90.

In the plasma etching apparatus 10, deposits such as reaction by-products, fine particles, and the like are accumulated and attached to the processing chamber 30, so that the inside of the processing chamber 30 is cleaned periodically. In the plasma etching apparatus 10, when the processing chamber 30 is exposed to the atmosphere for cleaning, a considerable amount of time (downtime) is required for temperature control and moisture control in the processing chamber 30 until it is possible to restart the etching process for the wafer W. As a result, the productivity of the plasma etching apparatus 10 decreases. Therefore, in order to reduce the downtime, it is preferable to clean the inside of the processing chamber 30 without exposing it to the atmosphere.

In the plasma etching apparatus 10, consumable parts are gradually consumed by repeatedly performing the etching process. The consumable part is, for example, the edge ring 35 disposed at the outer circumference of the wafer W placed on the placing surface 36d of the placing table 31. The edge ring 35 is abraded by exposure to plasma, and thus is replaced periodically. Generally, the consumable part is replaced in a state where the processing chamber 30 is opened to the atmosphere. However, in the plasma etching apparatus 10, when the consumable part is replaced in a state where the processing chamber 30 is opened to the atmosphere, downtime occurs. Therefore, in order to reduce the downtime, it is preferable to replace consumable parts without opening the system to the atmosphere.

Therefore, in the plasma etching apparatus 10, in addition to the first gate 84 used for loading and unloading the wafer W, a gate for cleaning the inside of the processing chamber 30 and replacing consumable parts is disposed in the processing chamber 30. For example, in the plasma etching apparatus 10, as shown in FIG. 1, a second gate 95 is disposed on the side opposite to the first gate 84 with respect to the placing table 31 on which the wafer W is placed. The second gate 95 is airtightly closed by a lid 96. A maintenance device 100 to be described later is detachably attached to the second gate 95. In the case of performing maintenance such as cleaning of the inside of the processing chamber 30 or replacement of consumable parts, an operator attaches the maintenance device 100 to the plasma etching apparatus 10 as a maintenance target.

[Configuration of Maintenance Device]

Figure 2:
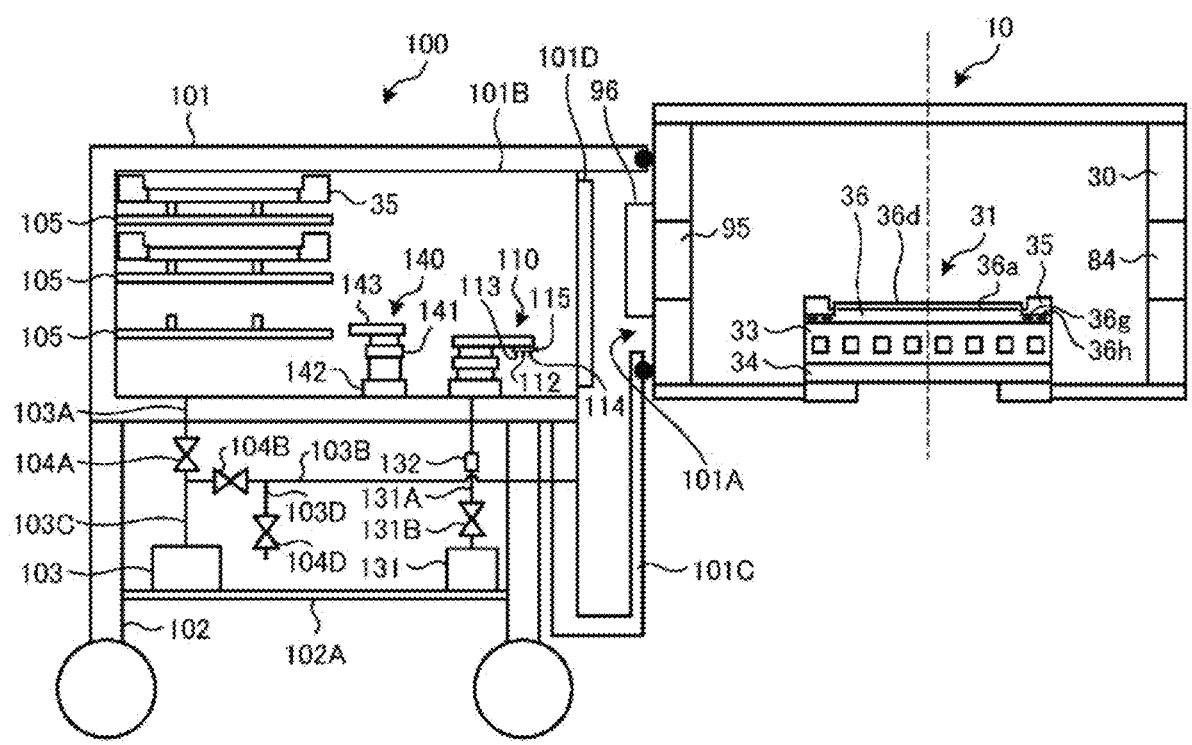
FIG. 2 is a cross-sectional view schematically showing a maintenance device according to an embodiment.

Next, the configuration of the maintenance device 100 according to an embodiment will be described. FIG. 2 is a cross-sectional view schematically showing the maintenance device 100 according to the embodiment. FIG. 2 shows a state in which the maintenance device 100 is attached to the plasma etching apparatus 10. The plasma etching apparatus 10 is illustrated in a simplified manner in the following drawings. Further, in the following description, the configuration of the maintenance device 100 will be appropriately described based on the flow of cleaning the placing table 31 as an object in the processing chamber 30 and replacing the edge ring 35 as a consumable part.

The maintenance device 100 has a case 101 having an opening 101A of which size corresponds to the second gate 95 of the plasma etching device 10. The size corresponding to the second gate 95 allows a suction mechanism 110 to be described later and the edge ring 35 to be moved or loaded/unloaded between the case 101 and the processing chamber 30 through the second gate 95. The size corresponding to the second gate 95 may vary as long as the suction mechanism 110 or the edge ring 35 can be moved or loaded/unloaded between the case 101 and the processing chamber 30. In the case 101, a sealing member such as an O-ring or the like is disposed at a portion around the opening 101A that is in contact with the plasma etching apparatus 10. The case 101 is mounted on a transport vehicle 102. The maintenance device 100 is transported to the position of the plasma etching apparatus 10 by the transport vehicle 102, and the opening 101A of the case 101 is disposed to correspond to the second gate 95. Then, the opening 101A of the case is airtightly attached to the second gate 95 by screw fixing or the like.

The case 101 includes a first case 101B and a second case 101C communicating with the first case 101B via an openable and closable shutter member 101D. The suction mechanism 110 to be described later is accommodated in the first case 101B. The opening 101A is formed in the second case 101C.

A first line 103A provided with a first valve 104A is connected to the first case 101B. A second line 103B provided with a second valve 104B is connected to the second case 101C. The first line 103A and the second line 103B are connected to a vacuum pump 103 through a common line 103C. The vacuum pump 103 is mounted on a platform 102A disposed at the transport vehicle 102. The second line 103B is branched to a leakage line 103D on the way to the common line 103C. A leakage valve 104D is disposed in the leakage line 103D. The vacuum pump 103, the first line 103A, the second line 103B, and the common line 103C constitute a depressurization mechanism for reducing a pressure in the case 101. In the maintenance device 100, the pressure in the case 101 is reduced to a predetermined vacuum level using the depressurization mechanism so that the pressure therein becomes equal to that in the processing chamber 30, and the lid 96 is removed so that the case 101 and the processing chamber 30 can communicate with each other through the opening 101A and the second gate 95.

Further, the maintenance device 100 has, in the case 101 (the first case 101B), the suction mechanism 110 for conducting suction of deposits on the placing table 31 in the processing chamber 30.

Figure 3:
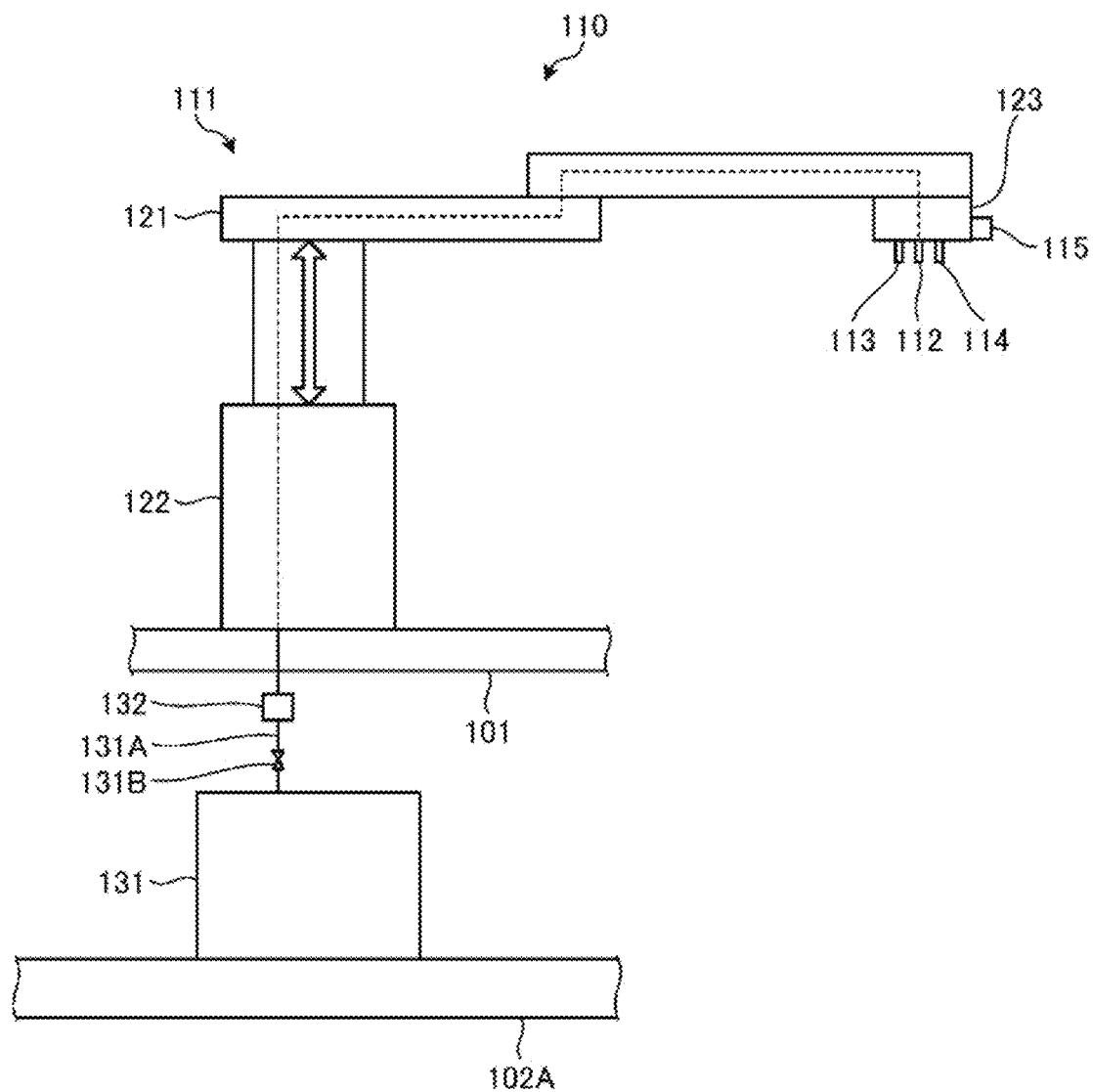
FIG. 3 specifically shows a suction mechanism according to an embodiment.

FIG. 3 specifically shows the suction mechanism 110 according to an embodiment. The suction mechanism 110 has a robot arm 111, and suction ports 112, a supply port 113, an irradiation part 114, and an imaging part 115 that are disposed at the tip end of the robot arm 111.

The robot arm 111 includes an arm portion 121 in which two arm elements are connected by a joint, a support portion 122 for supporting the arm portion 121 to be rotatable and vertically movable, and a head portion 123 disposed at the tip end of the arm portion 121. The robot arm 111 can extend and contract by linearly extending the two arm elements of the arm portion 121 or overlapping them. The robot arm 111 can vertically move the head portion 123 at the tip end of the arm portion 121 by raising and lowering the arm portion 121 using the support portion 122. The robot arm 111 can extend the two arm elements of the arm portion 121 toward the opening 101A to bring the head section 123 close to the placing table 31 through the opening 101A. The overall operation of the robot arm 111 is controlled by a controller (not shown). The controller has a user interface that receives various operation instructions or displays operation states. An operator executes an operation instruction using the user interface. The operation instruction individually specifies the movement of the robot arm 111, for example. Further, the operation instruction may specify a series of movements. For example, the operation instruction may specify a series of movements of the robot arm 111 at the time of conducting suction of deposits on the placing table 31 as a suction instruction.

The head portion 123 is provided with the suction ports 112, the supply port 113, the irradiation part 114, and the imaging part 115. The arrangement positions of the suction ports 112, the supply port 113, the irradiation part 114, and the imaging part 115 will be described later.

When the head part 123 approaches the placing table 31, the suction ports 112 conduct suction of deposits on the placing table 31. In other words, the suction ports 112 are connected to an exhaust device 131 on the platform 102A through an exhaust line 131A provided with a valve 131B and penetrating through the robot arm 111, and conducts suction of the deposits on the placing table 31 based on the exhaust operation performed by the exhaust device 131.

When the head portion 123 approaches the placing table 31, the supply port 113 supplies a gas to the placing table 31. The gas supplied from the supply port 113 is an inert gas, a gas that reacts with the deposits to facilitate suction of the deposits on the placing table 31, or a gas that reacts with the deposits to gasify the deposits. The inert gas may be Ar, $N_2$, dry air, or the like, for example. In the case of using the inert gas, the gas flow rate is appropriately set to blow away the deposits adhered to the placing table 31. The gas that reacts with the deposits to facilitate suction of the deposits from the placing table 31 or the gas that reacts with the deposits to gasify the deposits may be nitrogen trifluoride gas ($NF_3$), fluorine gas ($F_2$), or the like. The suction ports 112 conduct suction of the deposits together with the gas supplied from the supply port 113. The supply port 113 is connected to a gas supply source (not shown) through a line penetrating through the robot arm 111, and supplies a gas supplied from the gas supply source to the placing table 31.

When the head unit 123 approaches the placing table 31, the irradiation part 114 irradiates the placing table 31 with plasma to remove the deposits from the placing table 31. The irradiation part 114 can reduce the adhesive power of the deposits or gasify the deposits by causing ions or radicals in the plasma to react with the deposits. The deposits whose adhesive power is reduced or the gasified deposits are separated from the placing table 31 and sucked from the suction ports 112. The irradiation part 114 irradiates the placing table 31 with plasma obtained by applying the RF power to a gas such as an oxygen-containing gas ($O_2$, $CO_2$, or the like), a gas containing an oxygen-containing gas and a rare gas (such as a gas containing $O_2$ and Ar or the like), or a fluorine-containing gas ($CF_4$, or the like). The irradiation part 114 may irradiate the placing table 31 with laser, or may irradiate the placing table 31 with plasma and laser. The laser may heat the deposits to reduce the adhesive power of the deposits. The laser may have a wavelength in which the deposits are gasified. For example, a semiconductor laser having a wavelength of 808 nm, a laser spot area of 0.5 mm to 3 mm, and a laser power of 200 W may be used. Further, the irradiation part 114 may irradiate the placing table 31 with laser in an environment in which a gas (for example, ozone gas or the like) capable of reducing the adhesive force of the deposits or gasifying the deposits exists.

The imaging part 115 is an image sensor, for example, and images the placing table 31 when the head part 123 approaches the placing table 31. The imaging part 115 may image the placing table 31 while irradiating light, if necessary. The overall operation of the imaging part 115 is controlled by a controller (not shown). The imaging part 115 outputs a captured image of the placing table 31 to the controller. The controller detects whether or not deposits exist on the placing table 31 from the captured image. When deposits are detected from the captured image, the controller controls the exhaust device 131 to start suction of the deposits from the suction ports 112.

A measuring device 132 is disposed in the exhaust line 131A. The measuring device 132 measures the diameter and the number of particles flowing through the exhaust line 131A, and outputs information on the number of particles for each predetermined particle size and information on the total number of particles to a controller (not shown). When the suction from the suction ports 112 is conducted, the controller monitors whether or not the number of particles for each predetermined particle size and the total number of fine particles obtained from the measuring device 132 are smaller than or equal to a predetermined threshold. When the number of particles for each predetermined particle size and the total number of fine particles are smaller than or equal to the predetermined threshold, the controller controls the exhaust device 131 to stop the suction from the suction ports 112.

Figure 4:
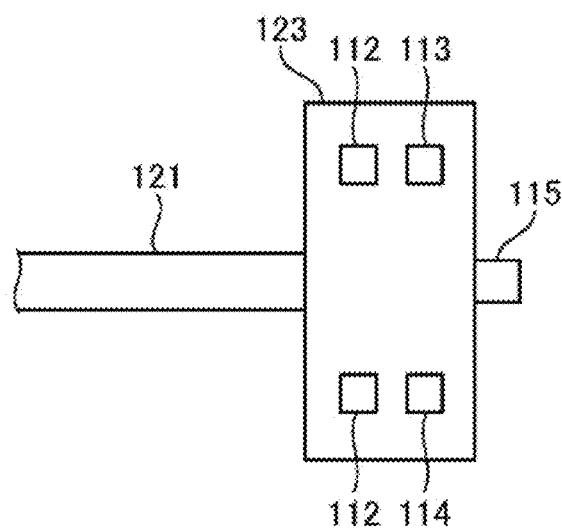
FIG. 4 shows an example of the arrangement of a suction port, a supply port, an irradiation part, and an imaging part according to an embodiment.
Figure 5:
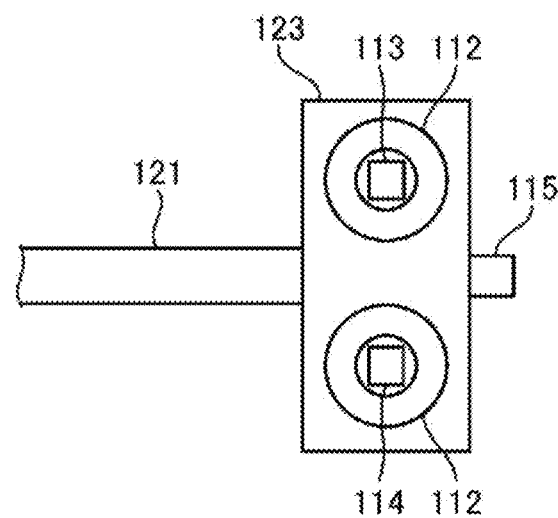
FIG. 5 shows another example of the arrangement of the suction port, the supply port, the irradiation part, and the imaging part according to the embodiment.

FIG. 4 shows an example of the arrangement of the suction ports 112, the supply port 113, the irradiation part 114, and the imaging part 115 according to an embodiment. FIG. 4 shows a bottom view of the head portion 123 of the robot arm 111. The head portion 123 is formed in a rectangular shape in which a pair of short sides face each other with the arm portion 121 interposed therebetween in plan view. The suction ports 112 are disposed on the inner short sides of the head portion 123. The supply port 113 is disposed adjacent to one of the two suction ports 112, and the irradiation part 114 is disposed adjacent to the other suction port 112. The imaging part 115 is disposed to correspond to one of the long sides of the head part 123 that is opposite to the long side where the arm portion 121 is disposed. The arrangement positions of the suction ports 112, the supply port 113, the irradiation part 114, and the imaging part 115 shown in FIG. 4 are an example, and the present disclosure is not limited thereto. For example, as shown in FIG. 5, the suction ports 112 may be disposed on the inner short sides of the head part 123 to surround the outer periphery of the supply port 113 and the outer periphery of the irradiation part 114. FIG. 5 shows another example of the arrangement of the suction ports 112, the supply port 113, the irradiation part 114, and the imaging part 115 according to the embodiment.

Referring back to FIG. 2, the maintenance device 100 has, in the case 101, a transfer mechanism 140 for unloading the edge ring 35 from the processing chamber 30 and loading the edge ring 35 into the processing chamber 30. The transfer mechanism 140 includes a multi-joint arm portion 141, a support portion 142 for supporting the arm portion 141 to be rotatable and vertically movable, and a fork portion 143 disposed at the tip end of the arm portion 141. The transfer mechanism 140 can extend and contract by linearly extending the arm portion 141 or overlapping the arm portion 141. The transfer mechanism 140 can vertically move the fork portion 143 disposed at the tip end of the arm portion 141 by raising and lowering the arm portion 141 using the support portion 142. The overall operation of the transfer mechanism 140 is controlled by a controller (not shown). The controller has a user interface that receives various operation instructions or displays operation states. An operator executes an operation instruction using the user interface. The operation instruction individually specifies the movement of the transfer mechanism 140, for example. Further, the operation instruction may specify a series of movements. For example, the operation instruction may specify a series of movements of the transfer arm 140 at the time of loading and unloading the edge ring 35 as a transfer instruction.

In the case 101, support tables 105 are arranged in three stages at predetermined height intervals, for example. The replacement edge rings 35 are placed on two of the three support tables 105. The other support table 105 is empty so that a used edge ring 35 can be placed. The replacement edge ring 35 is a new unused edge ring, for example. The replacement edge ring 35 may be a used edge ring having a relatively small consumption amount.

Figure 6:
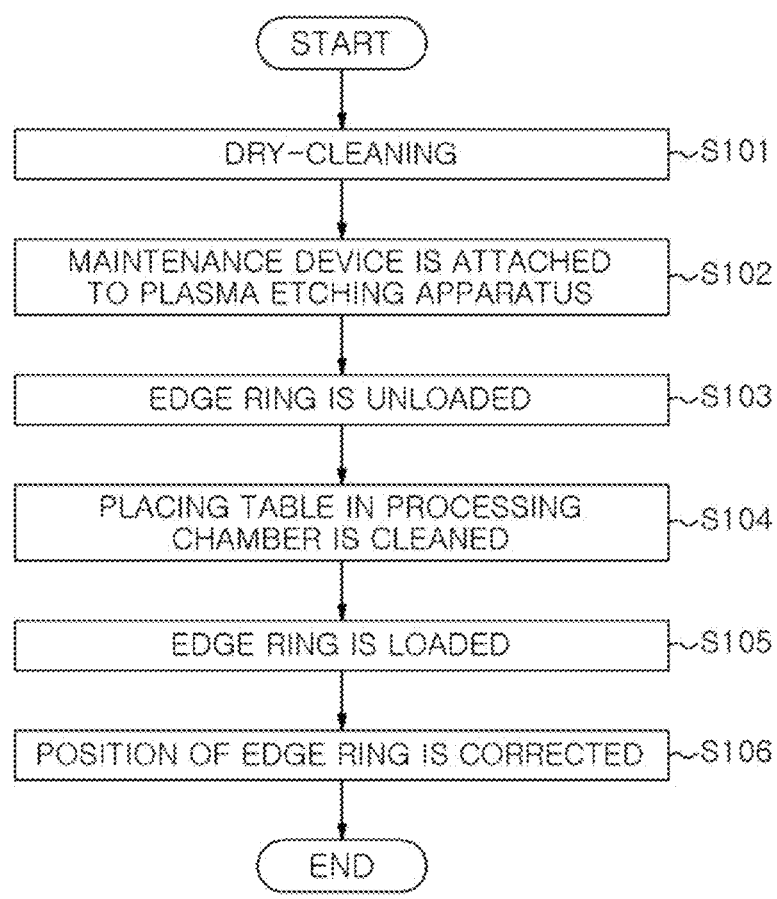
FIG. 6 is a flowchart showing an example of a processing operation of a vacuum processing system according to an embodiment.

Next, a specific processing operation of the vacuum processing system including the plasma etching apparatus 10 and the maintenance device 100 will be described with reference to FIG. 6. FIG. 6 is a flowchart showing an example of the processing operation of the vacuum processing system according to an embodiment. The processing operation shown in FIG. 6 is mainly executed under the control of a controller (not shown).

First, the processing chamber 30 is dry-cleaned in a state where the edge ring 35 is placed on the placing table 21 (step S101).

When the dry cleaning is completed, the maintenance device 100 is attached to the plasma etching apparatus 10 (step S102).

When the installation of the maintenance device 100 is completed, the edge ring 35 is unloaded from the processing chamber 30 (step S103).

Next, the placing table 31 in the processing chamber 30 is cleaned by the maintenance device 100 (step S104).

When the cleaning is completed, the replacement edge ring 35 is loaded into the processing chamber 30 (step S105).

Then, the position of the edge ring 35 is corrected (step S106).

Figure 7A:
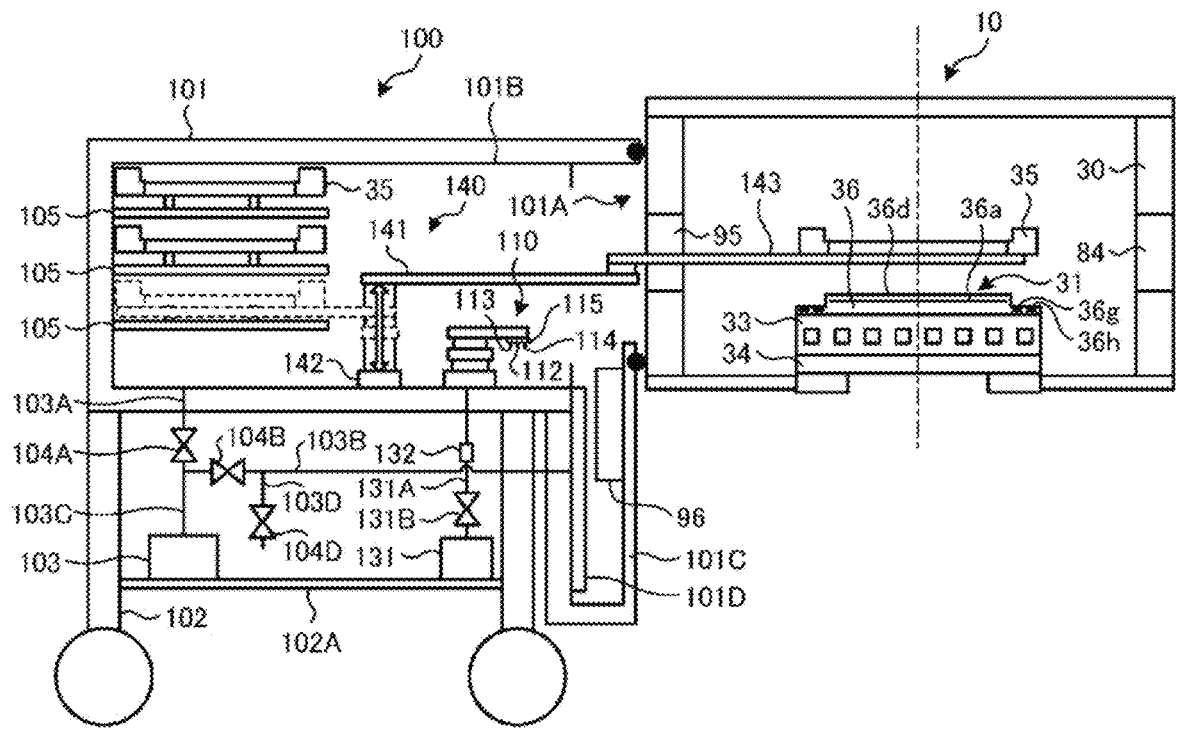
FIG. 7A explains an example of an operation for unloading an edge ring from a processing chamber and cleaning a placing table.
Figure 7B:
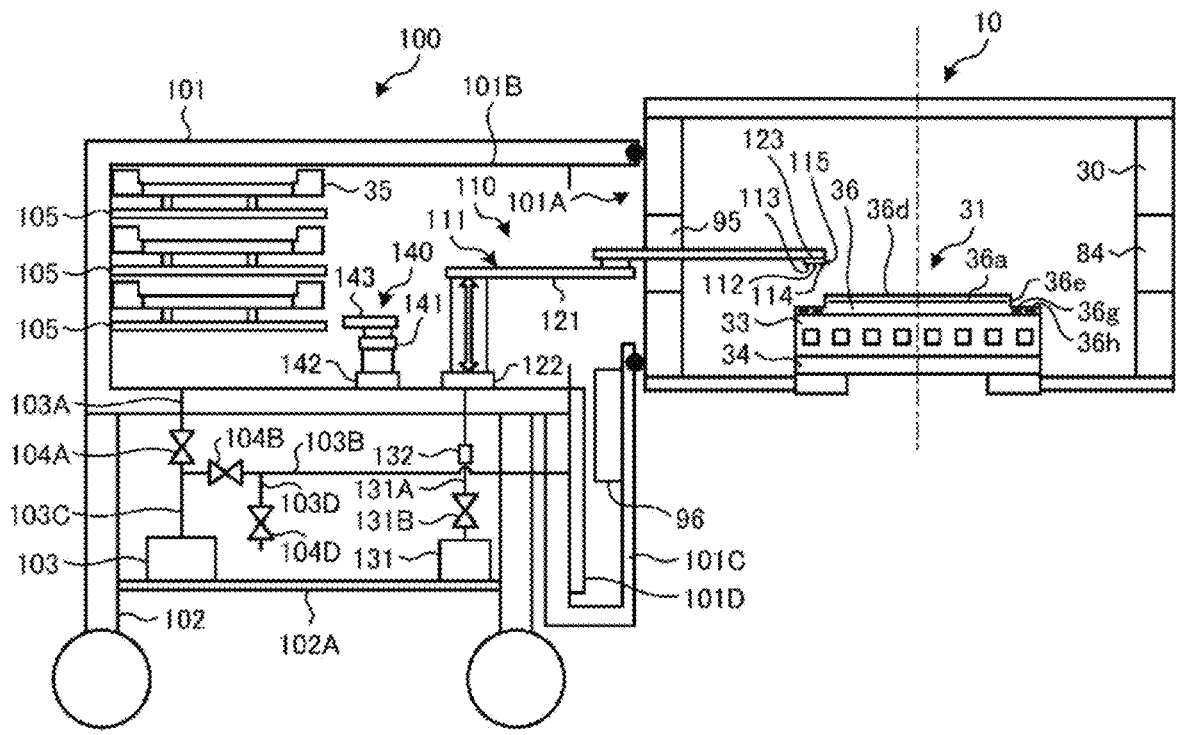
FIG. 7B explains an example of the operation for unloading the edge ring from the processing chamber and cleaning the placing table.
Figure 8:
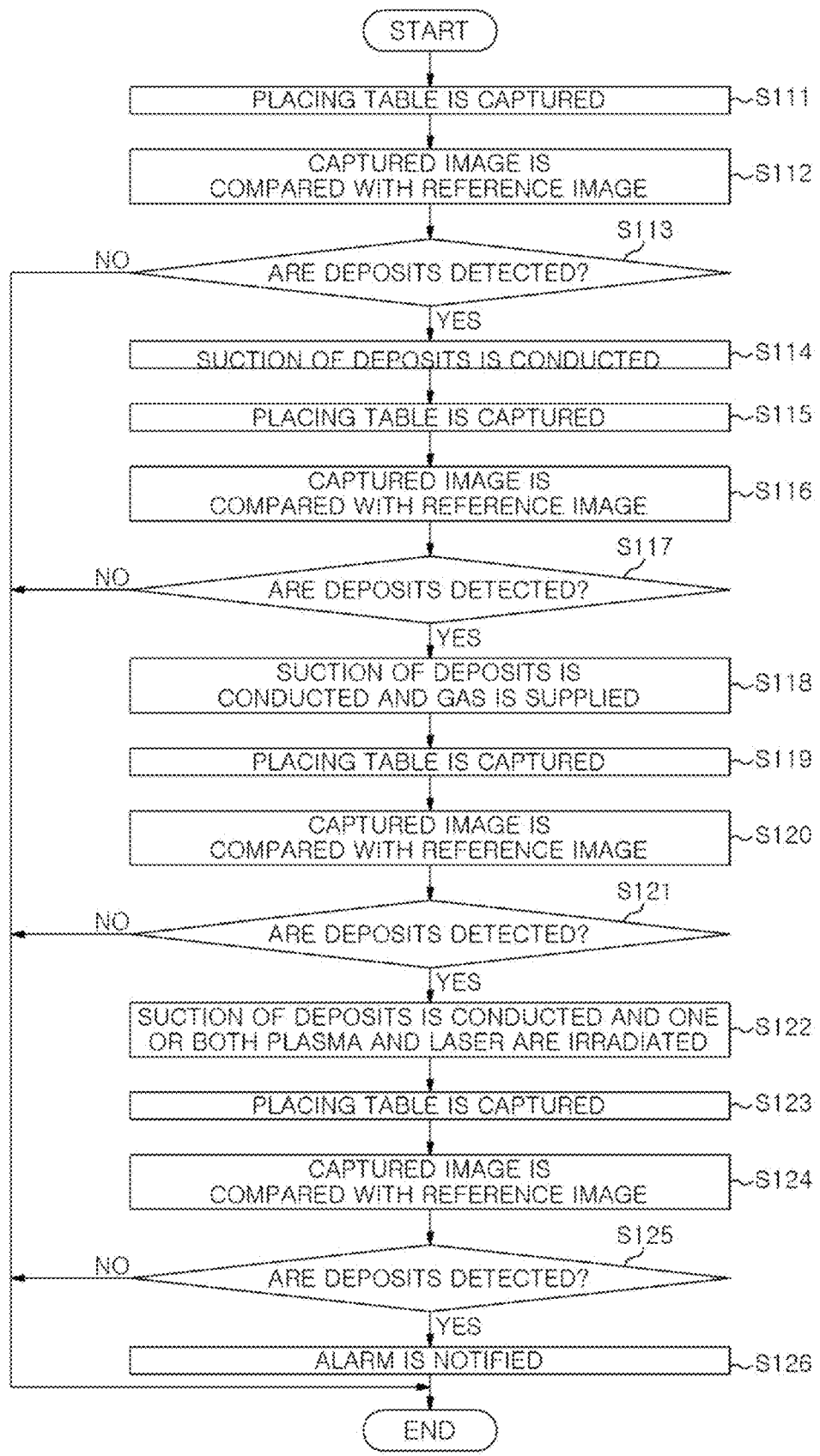
FIG. 8 is a flowchart showing an example of a process of cleaning the placing table.

Next, an example of the operation for unloading the edge ring 35 from the processing chamber 30 and cleaning the placing table 31 will be described with reference to FIGS. 7A, 7B, and 8. FIGS. 7A and 7B explain an example of the operation for unloading the edge ring 35 from the processing chamber 30 and cleaning the placing table 31. FIG. 8 is a flowchart showing an example of processing for cleaning the placing table 31. The processing of FIG. 8 corresponds to the processing of step S104 of FIG. 6.

An operator moves the transport vehicle 102 to transport the maintenance device 100 to the position of the plasma etching apparatus 10. At this time, the first valve 104A is controlled to be opened. Then, the vacuum pump 103 reduces the pressure in the first case 101B in a state where the shutter member 101D is closed. The maintenance device 100 may be configured to be automatically transported to the position of the plasma etching apparatus 10 based on instructions from the controller 90 or remote instructions. Then, the opening 101A of the case 101 (the second case 101C) is airtightly attached to the second gate 95. When the opening 101A of the case 101 (the second case 101C) is attached to the second gate 95, the first valve 104A is switched from an open state to a closed state, and the second valve 104B is controlled to be opened. Next, the vacuum pump 106 reduces the pressure in the second case 101C. Accordingly, the pressure in both the first case 101B and the second case 101C, that is, the pressure in the entire case 101 is reduced. Thereafter, the shutter member 101D is opened so that the first case 101B and the second case 101C communicate with each other. Then, the second valve 104B is switched from the open state to the closed state.

The maintenance device 100 has, in the case 101, a removal unit (not shown) for removing the lid 96 of the plasma etching apparatus 10. In the case of unloading the edge ring from the processing chamber 30, as shown in FIG. 6A, the removal unit removes the lid 96 from the second gate 95 and retracts the removed lid 96 to a retract position in the case 101. Accordingly, the case 101 and the processing chamber 30 communicate with each other through the opening 101A and the second gate 95. When the case 101 and the processing chamber communicate with each other, lift pins (not shown) protrude from the placing table 31 to locate the edge ring 35 to a position above the placing table 31. When the edge ring 35 is electrostatically attracted, the lift pins protrude after the electrostatic attraction is released, so that the edge ring 35 is located to a position above the placing table 31. The transfer mechanism 140 moves the fork portion 143 at the tip end of the arm portion 141 to a height corresponding to the opening 101A using the support portion 142. The transfer mechanism 140 extends the arm portion 141 toward the opening 101a to move the fork portion 143 to a position below the edge ring 35 through the opening 101a. When the lift pins are lowered, the transfer mechanism 140 receives the edge ring supported on the lift pins using the fork portion 143. The transfer mechanism 140 contracts the arm portion 141 while holding the edge ring 35 to unload the edge ring 35 from the processing chamber 30.

Next, as indicated by dashed lines in FIG. 7A, the transfer mechanism 140 moves the fork portion 143 holding the edge ring 35 to a height corresponding to the empty support table 105. The transfer mechanism 140 moves the arm portion 141 toward the empty support table 105 to move the edge ring 35 to a position above the empty support table 105. The transfer mechanism 140 lowers the arm portion 141 to store the edge ring 35 in the empty support table 105.

Next, as shown in FIG. 7B, the robot arm 111 moves the head portion 123 at the tip end of the arm portion 121 using the support portion 122 to a height corresponding to the opening 101a. The robot arm 111 extends the arm portion 121 toward the opening 101a to bring the head portion 123 close to the placing table 31 through the opening 101a. As shown in FIG. 8, the imaging part 115 captures images of the placing table 31 from the top, and outputs the captured images to a controller (not shown) (step S111). In other words, the imaging part 115 outputs the captured images of the placing surface 36d, an outer peripheral surface 36e, and the ER placing surface 36f of the electrostatic chuck 36 to the controller. The controller detects whether or not deposits exist on the placing table 31 by comparing the captured images with a reference image obtained by imaging the cleaned or new placing table 31 in advance (step S112). When the deposits are detected from the captured images (step S113: Yes), the controller moves the suction ports 112 to the position of the deposits and controls the exhaust device 131 to start suction from the suction ports 112. Accordingly, the suction of the deposits on the placing table 31 (i.e., deposits remaining on the placing surface 36d, the outer peripheral surface 36e, and the ER placing surface 36f of the electrostatic chuck 36) from the suction ports 112 is conducted (step S114). For example, when dry cleaning is performed in a state where the edge ring 35 is placed on the placing table 31, reaction by-products are not completely removed from the outer peripheral surface 36e of the electrostatic chuck 36 and remain as deposits. In this case, the controller conducts suction of the deposits remaining, for example, on the outer peripheral surface 36e of the electrostatic chuck 36 from the suction ports 112.

The suction ports 112 may conduct suction of deposits on the placing table 31 in a state where the inert gas is supplied from the shower head 46 of the plasma etching apparatus 10 into the processing chamber 30 and the case 101. The inert gas may be, e.g., Ar, $N_2$, dry air, or the like. The supply source of the inert gas is not limited to the shower head 46, and may be, e.g., a purge port (not shown) through which a gas is supplied when the inside of the processing chamber 30 is opened to the atmosphere.

When the suction from the suction ports 112 is performed, the controller monitors whether or not the number of fine particles for each predetermined particle size and the total number of fine particles obtained from the measuring device 132 are smaller than or equal to the predetermined threshold. When the number of fine particles is smaller than or equal to the predetermined threshold, the controller controls the exhaust device 131 to stop the suction from the suction ports 112.

When the suction from the suction ports 112 is stopped, the imaging part 115 captures images of the placing table 31 from the top again, and outputs the captured images to the controller (step S115). The controller detects whether or not the deposits exist on the placing table 31 by comparing the captured images with the reference image obtained by imaging the cleaned or new placing table 31 in advance (step S116). When the deposits are detected from the captured images again (step S117: Yes), the controller controls the exhaust device 131 to start the suction from the suction ports 112. At this time, the supply port 113 supplies a gas to the placing table 31 (step S118). The suction ports 112 conduct suction of the deposits together with the gas supplied from the supply port 113. When the number of fine particles for each predetermined particle size and the total number of fine particles obtained from the measuring device 132 are smaller than or equal to the threshold, the controller controls the exhaust device 131 to stop the suction from the suction ports 112.

When the suction from the suction ports 112 is stopped, the imaging part 115 captures images of the placing table 31 from the top again, and outputs the captured images to the controller (step S119). The controller detects whether or not the deposits exist on the placing table 31 by comparing the captured images with the reference image obtained by imaging the cleaned or new placing table 31 in advance (step S120). When the deposits are detected from the captured image again (step S121: Yes), the controller controls the exhaust device 131 to start suction from the suction ports 112. At this time, the irradiation part 114 irradiates the placing table 31 with one or both of plasma and laser to remove the deposits from the placing table 31 (step S122). The suction ports 112 conduct suction of the deposits removed from the placing table 31. The controller may cause the suction ports 112 to conduct suction of the deposits after the irradiation part 114 irradiates the placing table 31 with one or both of plasma and laser. The controller controls the exhaust device 131 to stop the suction from the suction ports 112 when the number of fine particles obtained from the measuring device 132 is smaller than or equal to the threshold.

When the suction from the suction ports 112 is stopped, the imaging part 115 captures images of the placing table 31 from the top again, and outputs the captured images to the controller (step S123). The controller detects whether or not deposits exist on the placing table 31 by comparing the captured images with the reference image obtained by imaging the cleaned or new placing table 31 in advance (step S124). When the deposits are detected from the captured images again (step S125: Yes), the controller notifies an operator of the vacuum processing system of an alarm (step S126). The operator who has received the alarm opens the processing chamber 30 to the atmosphere, and performs maintenance including the cleaning of the placing table 31.

When the deposits are not detected from the captured image (step S113: No, step S117: No, step S121: No, step S125: No), the controller ends the processing of cleaning the placing table 31. In this manner, the placing table 31 is cleaned.

After the cleaning the placing table 31 is completed, the robot arm 111 retracts the arm portion 121 to return the suction ports 112, the supply port 113, the irradiation part 114, and the imaging part 115 to the original positions in the case 101.

Figure 9A:
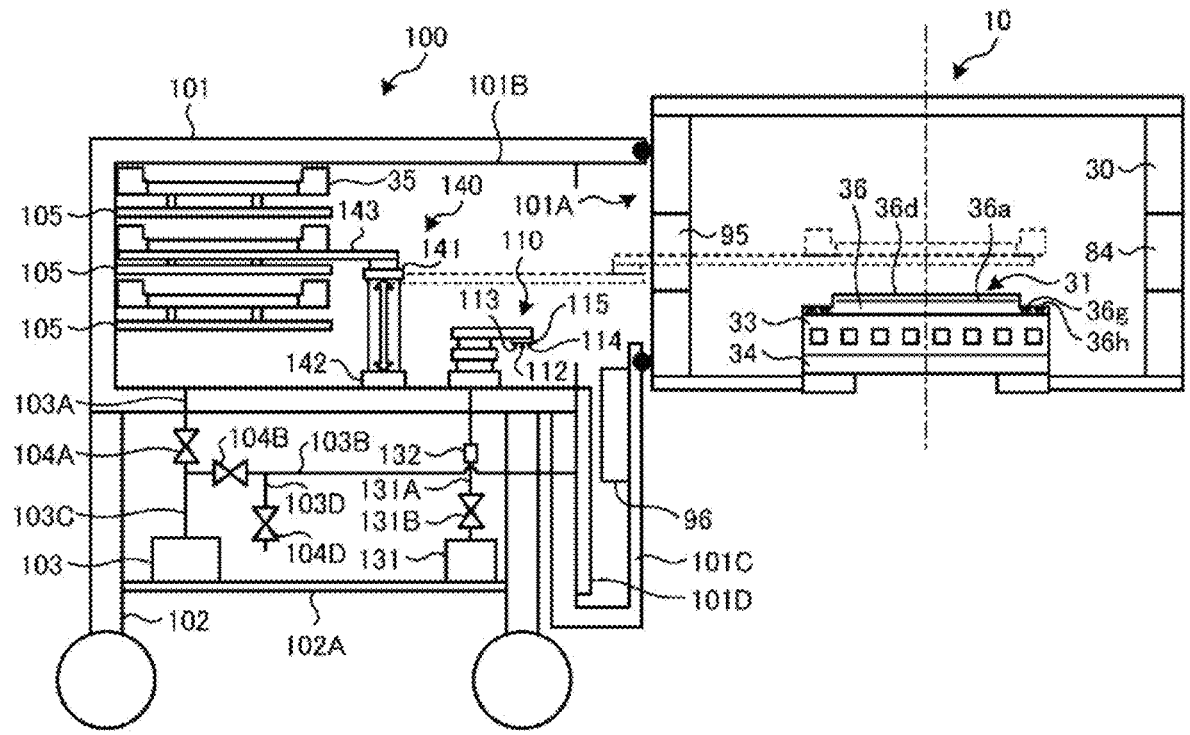
FIG. 9A explains an example of an operation for loading the edge ring into the processing chamber.
Figure 9B:
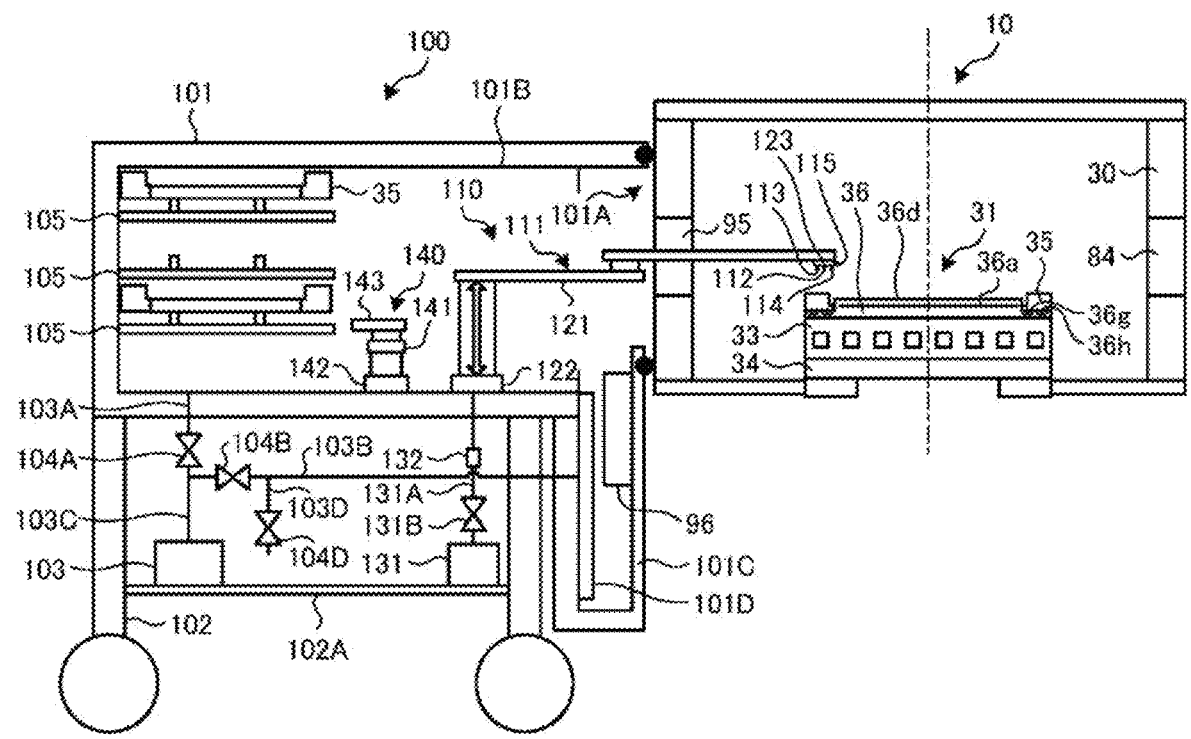
FIG. 9B explains an example of the operation for loading the edge ring into the processing chamber.
Figure 9C:
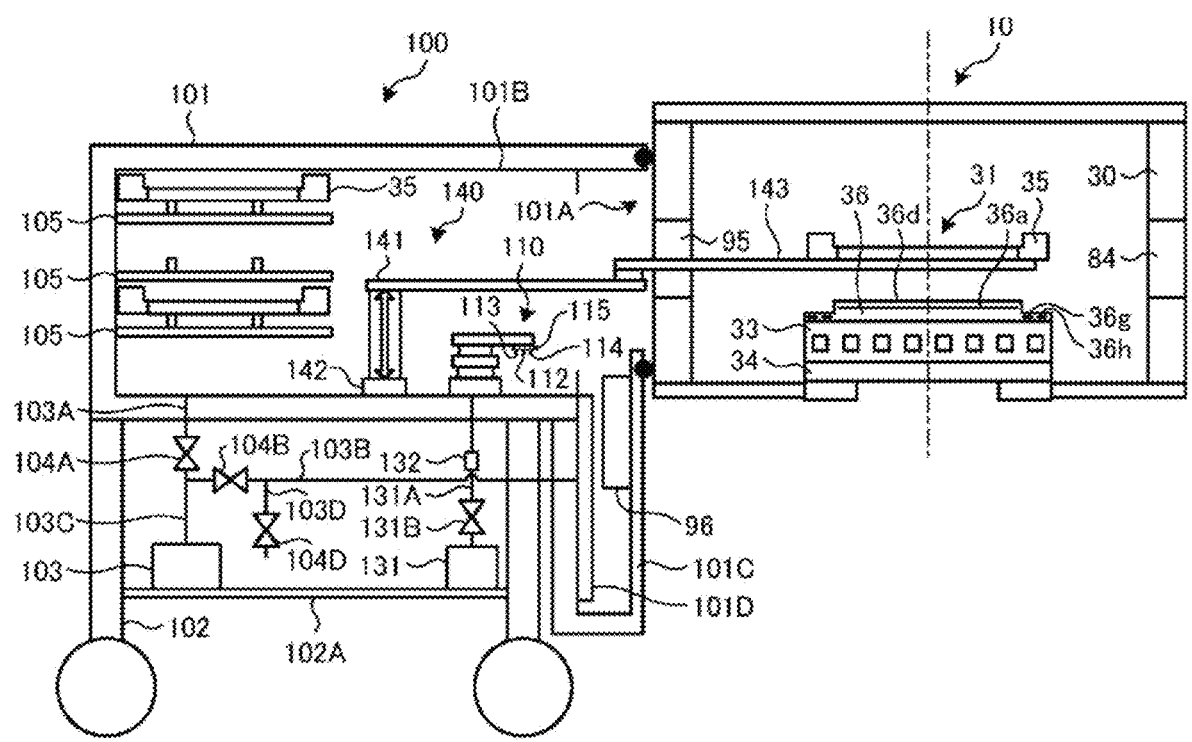
FIG. 9C explains an example of the operation for loading the edge ring into the processing chamber.
Figure 10:
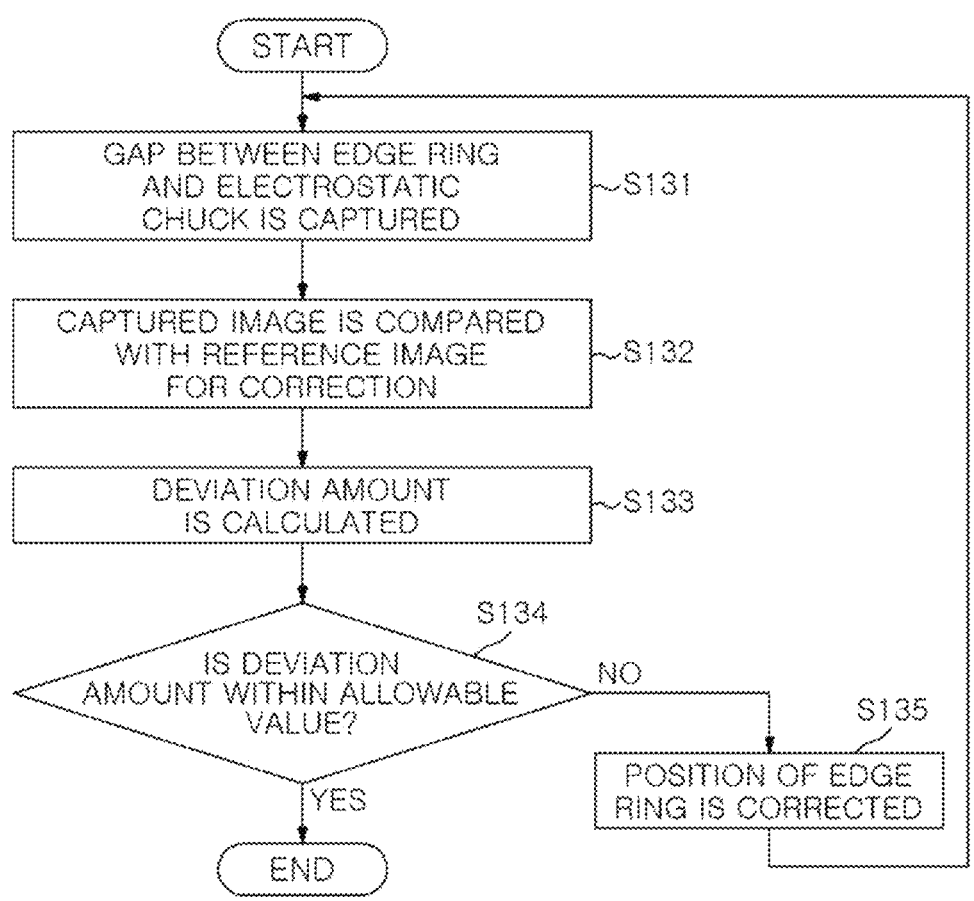
FIG. 10 is a flowchart showing an example of a process of correcting a position of the loaded edge ring.

Next, an example of an operation for loading the replacement edge ring 35 into the processing chamber 30 will be described with reference to FIGS. 9A to 9C. FIGS. 9A to 9C explain an example of the operation for loading the edge ring 35 into the processing chamber 30. FIG. 10 is a flowchart showing an example of processing of correcting the position of the edge ring 35. The processing of FIG. 10 corresponds to the processing of step S106 of FIG. 6.

In the case of loading the replacement edge ring 35 into the processing chamber 30, as shown in FIG. 9A, the transfer mechanism 140 moves the fork portion 143 to a height corresponding to the support table 105 on which the replacement edge ring 35 is placed. The transfer mechanism 140 moves the arm portion 141 toward the replacement edge ring 35 to hold the replacement edge ring 35 with the fork portion 143. The transfer mechanism 140 moves the arm portion 141 toward the opening 101a while holding the replacement edge ring 35.

Next, as indicated by the dashed lines of FIG. 9A, the transfer mechanism 140 moves the fork portion 143 to a height corresponding to the opening 101a. The transfer mechanism 140 extends the arm portion 141 toward the opening 101A and transports the replacement edge ring 35 to a position above the placing table 31 through the opening 101A.

When the fork portion 143 holding the replacement edge ring 35 reaches a position above the placing table 31, a lift pins (not shown) protrude from the placing table 31, and the replacement edge ring 35 is transferred from the fork portion 143 to the lift pins. When the replacement edge ring 35 is transferred from the fork portion 143 to the lift pins, the transfer mechanism 140 retracts the arm portion 121 to return the fork portion 143 to its original position in the case 101. The lift pins supporting the replacement edge ring 35 are lowered, and the replacement edge ring 35 is placed on the outer peripheral portion of the placing table 31.

Next, as shown in FIG. 9B, the robot arm 111 moves the head portion 123 to a height corresponding to the opening 101A. The robot arm 111 extends the arm portion 121 toward the opening 101a, and brings the head portion 123 close to the placing table 31 through the opening 101a. As shown in FIG. 10, the imaging part 115 images the gap between the replacement edge ring 35 and the electrostatic chuck 36 of the placing table 31 at each of multiple positions in the circumferential direction (step S131). For example, the imaging part 115 sequentially images the gap between the replacement edge ring 35 and the electrostatic chuck 36 of the placing table 31 at multiple imaging positions set at equal intervals in the circumferential direction of the placing table 31.

Figure 11:
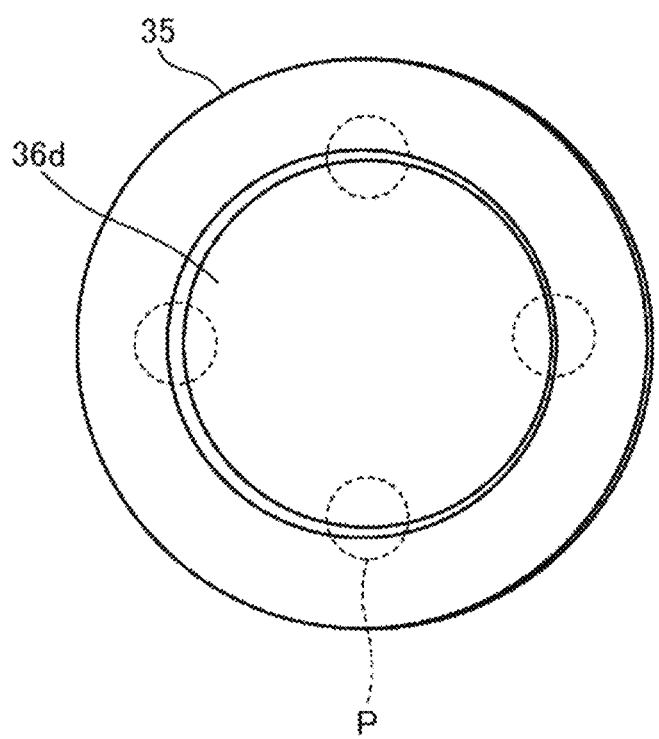
FIG. 11 shows an example of an imaging position in the imaging part.

FIG. 11 shows an example of imaging positions in the imaging part 115. FIG. 11 is a top view of the replacement edge ring 35 and the electrostatic chuck 36 of the placing table 31 viewed from the top. FIG. 11 shows the disc-shaped placing surface 36d of the placing table 31, and the ring-shaped replacement edge ring 35 disposed around the placing surface 36d. Four imaging positions P in the imaging part 115 are set at equal intervals of 90 degrees in the circumferential direction of the placing table 31. The imaging positions may be set to three or less, or may be set to five or more in the circumferential direction of the placing table 31. The imaging part 115 may collectively image the gap between the replacement edge ring 35 and the electrostatic chuck 36 of the placing table 31.

Referring back to FIG. 9B, the imaging part 115 outputs the images of the gap between the replacement edge ring 35 and the electrostatic chuck 36 of the placing table 31 that are captured at multiple positions in the circumferential direction to a controller (not shown). As shown in FIG. 10, the controller compares the captured images with a reference image for correction obtained by imaging the edge ring 35 in a state where there is no deviation in advance (step S132), and then calculates the deviation amount between the width of the gap and the reference width for each of the multiple positions in the circumferential direction (step S133). The reference width is, for example, the width of the gap that is measured in advance when the center of the replacement edge ring 35 coincides with the center of the electrostatic chuck 36.

Next, the controller determines whether or not the calculated deviation amount is within an allowable value (step S134). If the calculated deviation amount is not within the allowable value (step S134: No), the controller controls the transfer mechanism 140 to correct the position of the replacement edge ring 35 by the calculated deviation amount (step S135). In other words, when lift pins (not shown) protrude from the placing table 31 and the replacement edge ring 35 is positioned above the placing table 31, the transfer mechanism 140 moves the fork portion 143 to a position corresponding to the opening 101a as shown in FIG. 9C. Then, the transfer mechanism 140 extends the arm portion 141 toward the opening 101a to move the fork portion 143 to a position below the replacement edge ring 35 through the opening 101a. When the lift pins are lowered, the transfer mechanism 140 receives the replacement edge ring 35 supported on the lift pins using the fork portion 143. The transfer mechanism 140 horizontally moves the arm portion 141 while holding the replacement edge ring 35 such that the calculated deviation amount becomes zero. When the replacement edge ring 35 moves and the displacement amount becomes 0, the lift pins protrude from the placing table 31, and the replacement edge ring 35 is transferred from the fork portion 143 to the lift pins. When the replacement edge ring 35 is transferred from the fork portion 143 to the lift pins, the transfer mechanism 140 retracts the arm portion 121 to return the fork portion 143 to its original position in the case 101. The lift pins supporting the replacement edge ring 35 are lowered, and the replacement edge ring 35 is placed on the outer peripheral portion of the placing table 31. After the deviation amount is corrected, the controller returns the processing to step S131. The imaging part 115 images the gap between the replacement edge ring 35 and the electrostatic chuck 36 of the placing table 31, and it is determined whether or not the deviation amount is within the allowable value (steps S131 to S134). When the deviation amount is not within the allowable value, the controller may perform the correction again such that the deviation amount of the replacement edge ring 35 becomes 0 as described above (step S135).

When the calculated deviation amount is within the allowable value (step S134: Yes), the controller ends the processing. Accordingly, the loading of the replacement edge ring 35 into the processing chamber 30 is completed.

When the loading of the edge ring 35 into the processing chamber 30 is completed, the maintenance device 100 controls the removal unit to attach the lid 96 to the second gate 95. Then, the second case 101C is exposed to the atmosphere by opening the leakage valve 104D in a state where the shutter member 101D is closed. After the maintenance inside the processing chamber 30 is performed in that order, an operator moves the transport vehicle 102 to separate the maintenance device 100 from the plasma etching apparatus 10. The maintenance device 100 may be configured to be automatically separated from the plasma etching apparatus 10 and automatically transported to a predetermined position based on instructions from the controller 90 or remote instructions.

As described above, the maintenance device 100 according to the embodiment includes the case 101 having the opening 101A of which size corresponds to the second gate 95 of the plasma etching apparatus 10, and the opening 101A can be airtightly attached to the second gate 95. The maintenance device 100 further includes the suction mechanism 110 that is disposed in the case 101, enters the processing chamber 30 through the opening 101A, and conducts suction of deposits on the object (for example, the placing table 31) in the processing chamber 30. Accordingly, the maintenance device 100 can efficiently clean the inside of the processing chamber without opening it to the atmosphere.

The suction mechanism 110 has the robot arm 111 whose tip end can approach the object in the processing chamber 30 through the opening 101A. Further, the suction mechanism 110 has the suction ports 112 that are disposed at the tip end (for example, the head portion 123) of the robot arm 111 and conduct suction of the deposits on the object in the processing chamber 30. Accordingly, the maintenance device 100 can conduct suction of the deposits from the suction ports 112 near the object in the processing chamber 30.

The suction ports 112 conduct suction of the deposits in a state where an inert gas is supplied into the processing chamber 30. Accordingly, the maintenance device 100 can conduct suction of the deposits together with the inert gas through the suction ports 112.

The suction mechanism 110 further has the supply port 113 that is disposed at the tip end of the robot arm 111 and supplies a gas to the object in the processing chamber 30. Accordingly, the maintenance device 100 can conduct suction of the deposits together with the inert gas from the suction ports 112 while blowing off the deposits on the object in the processing chamber 30 using the inert gas.

The suction mechanism 110 further has the irradiation part 114 that is disposed at the tip end of the robot arm 111 and irradiates the object in the processing chamber 30 with one or both of plasma and laser to remove the deposits from the object in the processing chamber 30. Accordingly, the maintenance device 100 can conduct suction of the deposits removed from the object in the processing chamber 30 using the suction ports 112.

The suction mechanism 110 further has the imaging part 115 that is disposed at the tip end of the robot arm 111 and images the object in the processing chamber 30. Accordingly, the maintenance device 100 can obtain the captured image to be used for detecting whether or not deposits exist.

The maintenance device 100 further includes the exhaust device 131 connected to the suction ports 112 through the exhaust line 131A, and the measuring device 132 for measuring the number of particles flowing through the exhaust line 131A. The exhaust device 131 stops the suction from the suction ports 112 when the number of fine particles for each predetermined particle size and the total number of fine particles measured by the measuring device 132 are smaller than or equal to the predetermined threshold. Accordingly, the maintenance device 100 can stop the suction from the suction ports 112 at an appropriate timing.

The object in the processing chamber 30 is the placing table 31 having the electrostatic chuck 36 on which the wafer W can be placed and the outer peripheral portion on which the edge ring 35 can be placed, and the maintenance device 100 further includes the transfer mechanism 140. The transfer mechanism 140 is disposed in the case 101 and performs unloading of the edge ring 35 from the processing chamber 30 and loading of the edge ring 35 into the processing chamber through the opening 101A. Accordingly, the maintenance device 100 can clean the inside of the processing chamber 30 and replace the edge ring 35 without opening it to the atmosphere.

Further, the suction ports 112 conduct suction of the deposits on the outer peripheral surface of the placing portion (for example, the electrostatic chuck 36) of the placing table 31 in a state in which the edge ring 35 is unloaded from the processing chamber 30 by the transfer mechanism 140. Accordingly, the maintenance device 100 can clean the outer peripheral surface of the placing portion of the placing table 31 that is exposed by unloading the edge ring 35.

The transfer mechanism 140 loads the replacement edge ring 35 into the processing chamber 30 and places it on the outer peripheral portion of the placing table 31. The maintenance device 100 further includes the controller. The controller captures images of the gap between the replacement edge ring 35 and the placing portion of the placing table 31 at multiple positions in the circumferential direction using the imaging part 115 disposed at the tip end of the robot arm 111. The controller calculates the amount deviation between the width of the gap and the reference width for each of the multiple positions in the circumferential direction based on the captured images. The controller controls the transfer mechanism 140 to correct the position of the replacement edge ring 35 by the calculated deviation amount. Accordingly, the maintenance device 100 can appropriately correct the position of the replacement edge ring 35 placed on the outer peripheral portion of the placing table 31.

(Modification)

In the above embodiments, the case of cleaning the placing table 31 as an object in the processing chamber 30 has been described as an example. However, the present disclosure is not limited thereto. The maintenance device 100 may clean components other than the placing table 31 as long as they are disposed in the processing chamber 3. Further, the controller may compare a captured image of a component in the processing chamber 30 with a captured image of a new component obtained by the imaging part 115 to determine whether or not the component in the processing chamber 30 is normal based on at least one of the surface state, the shape, and/or the size. The controller may output a component replacement instruction when it is determined that abnormality has occurred in the component in the processing chamber 30.

Further, in the above embodiments, the case where the edge ring 35 is replaced as a consumable component has been described as an example. However, the present disclosure is not limited thereto. The consumable component to be replaced may be a cover ring (not shown) disposed on the outer peripheral side of the edge ring 35 other than the edge ring 35, or may be any component that can be loaded into and unloaded from the processing chamber 30 by the transfer mechanism such as a robot arm or the like.

In the above embodiment, the case where the suction mechanism 110 has the suction ports 112, the supply port 113, the irradiation part 114, and the imaging part 115 at the tip end of the robot arm 111 has been described. However, the supply ports 112, the irradiation part 114, and the imaging part 115 may not form a set with the suction ports 112. For example, any one of the combination of the suction ports 112 and the supply port 113, the combination of the suction ports 112 and the irradiation part 114, the combination of the suction ports 112 and the imaging part 115, the combination of the suction ports 112, the supply port 113, and the irradiation part 114, the combination of the suction ports 112, the supply port 113, and the imaging part 115, and the combination of the suction ports 112, the irradiation part 114, and the imaging part 115 may be provided at the tip end of the robot arm 111.

In the above embodiment, the case where both the suction mechanism 110 and the transfer mechanism 140 are disposed in the case 101 has been described. However, the present disclosure is not limited thereto. For example, only the suction mechanism 110 may be disposed in the case 101, and a part of the robot arm 111 of the suction mechanism 110 may be replaced with a pick for edge ring replacement. Alternatively, for example, only the suction mechanism 110 may be disposed in the case 101, and a pick for edge ring replacement may be attached to the robot arm 111 of the suction mechanism 110. In that case, the edge ring 35 may be replaced using the pick for edge ring replacement. The replacement of the pick and the attachment of the pick may be performed by an operator, or may be realized by automatic replacement.

It should be noted that the embodiments of the present disclosure are illustrative in all respects and are not restrictive. The above-described embodiments may be omitted, replaced, or changed in various forms without departing from the scope of the appended claims and the gist thereof.

DESCRIPTION OF REFERENCE NUMERALS

10: plasma etching apparatus
30: processing chamber
31: placing table
35: edge ring
36: electrostatic chuck
84: first gate
95: second gate
100: maintenance device
101: case
101A: opening
110: suction mechanism
111: robot arm
112: suction port
113: supply port
114: irradiation part
115: imaging part
131: exhaust device
131A: exhaust line
132: measuring device
140: transfer mechanism

The invention claimed is:

1. A maintenance device to be detachably attached to a processing chamber of a vacuum processing device in which a substrate is processed and deposits are formed on an object therein, the processing chamber having a first gate used for loading and unloading the substrate and a second gate through which the substrate is not transferred, the maintenance device comprising:
a case having an opening and capable of being separated from the processing chamber, wherein the opening is attached to the second gate of the processing chamber in a detachable manner and an airtight manner;
a depressurization mechanism including a vacuum pump to reduce a pressure in the case;
a suction mechanism disposed in the case and including an arm and a suction port to enter the processing chamber through the opening and conduct suction of the deposits on the object in the processing chamber, wherein the arm has a tip end that is accessible to the object in the processing chamber through the opening, and the suction port is disposed at the tip end of the arm, wherein the object in the processing chamber is a placing table having a placing portion on which the substrate is placed and an outer peripheral portion on which an edge ring is placed;
a transfer mechanism disposed in the case and including a fork portion to unload the edge ring from the processing chamber and load the edge ring into the processing chamber through the opening, wherein the transfer mechanism loads a replacement edge ring into the processing chamber and places the replacement edge ring on the outer peripheral portion of the placing table; and
a controller configured to image a gap between the replacement edge ring and the placing portion of the placing table at multiple positions in a circumferential direction using an imaging sensor disposed at the tip end of the arm, calculate a deviation amount between a width of the gap and a reference width for each of the multiple positions in the circumferential direction based on captured images, and correct a position of the replacement edge ring by the calculated deviation amount.

2. The maintenance device of claim 1, wherein the suction port conducts suction of the deposits in a state where an inert gas is supplied into the processing chamber.

3. The maintenance device of claim 1, wherein the suction mechanism further includes:
a supply port disposed at the tip end of the arm and configured to supply a gas to the object in the processing chamber.

4. The maintenance device of claim 1, wherein the suction mechanism further includes:
an irradiation part disposed at the tip end of the arm and configured to irradiate the object in the processing chamber with one or both of plasma and laser to remove the deposits from the object in the processing chamber.

5. The maintenance device of claim 1, wherein the suction mechanism further includes:
an imaging sensor disposed at the tip end of the arm and configured to image the object in the processing chamber.

6. The maintenance device of claim 1, further comprising:
an exhaust device including a vacuum pump connected to the suction port through an exhaust line,
wherein the exhaust device stops suction from the suction port when a number of fine particles measured in the exhaust line is smaller than or equal to a predetermined threshold.

7. The maintenance device of claim 1, wherein the suction port conducts suction of deposits on an outer peripheral surface of the placing portion of the placing table in a state where the edge ring is unloaded from the processing chamber by the transfer mechanism.

8. A vacuum processing system comprising:
a vacuum processing device; and
a maintenance device,
wherein the vacuum processing device includes:
a processing chamber; and
a first gate disposed in the processing chamber and used for loading and unloading a substrate; and
a second gate disposed in the processing chamber and to which the maintenance device is detachably attached,
wherein the maintenance device includes:
a case having an opening whose size corresponds to the second gate to which the opening is attached in an airtight manner;
a depressurization mechanism including a vacuum pump to reduce a pressure in the case; and
a suction mechanism disposed in the case and including an arm and a suction port to enter the processing chamber through the opening and conduct suction of deposits on an object in the processing chamber.

9. The vacuum processing system of claim 8, wherein the suction mechanism includes:
the arm having a tip end that is accessible to the object in the processing chamber through the opening; and
the suction port that is disposed at the tip end of the arm and conducts suction of the deposits on the object in the processing chamber.

10. The vacuum processing system of claim 9, wherein the suction port conducts suction of the deposits in a state where an inert gas is supplied into the processing chamber.

11. The vacuum processing system of claim 9, wherein the suction mechanism further includes:

a supply port disposed at the tip end of the arm and configured to supply a gas to the object in the processing chamber.

12. The vacuum processing system of claim 9, wherein the suction mechanism further includes:
an irradiation part disposed at the tip end of the arm and configured to irradiate the object in the processing chamber with one or both of plasma and laser to remove the deposits from the object in the processing chamber.

13. The vacuum processing system of claim 9, wherein the suction mechanism further includes:
an imaging sensor disposed at the tip end of the arm and configured to image the object in the processing chamber.

14. The vacuum processing system of claim 9, further comprising:
an exhaust device including a vacuum pump connected to the suction port via an exhaust line,
wherein the exhaust device stops suction from the suction port when a number of fine particles measured in the exhaust line is smaller than or equal to a predetermined threshold.

15. The vacuum processing system of claim 9, wherein the object in the processing chamber is a placing table having a placing portion on which the substrate is placed and an outer peripheral portion on which an edge ring is placed, further comprising:
a transfer mechanism disposed in the case and including a fork portion to unload the edge ring from the processing chamber and load the edge ring into the processing chamber through the opening.

16. The vacuum processing system of claim 15, wherein the suction port conducts suction of the deposits on an outer peripheral surface of the placing portion of the placing table in a state in which the edge ring is unloaded from the processing chamber by the transfer mechanism.

17. The vacuum processing system of claim 15, wherein the transfer mechanism loads a replacement edge ring into the processing chamber and places the replacement edge ring on the outer peripheral portion of the placing table, further comprising:
a controller configured to image a gap between the replacement edge ring and the placing portion of the placing table at multiple positions in a circumferential direction using an imaging sensor disposed at the tip end of the arm, calculate a deviation amount between a width of the gap and a reference width for each of the multiple positions in the circumferential direction based on captured images, and correct a position of the replacement edge ring by the calculated deviation amount.

\* \* \* \* \*